(12) United States Patent
Nihei

(10) Patent No.: US 7,883,968 B2
(45) Date of Patent: Feb. 8, 2011

(54) FIELD EFFECT TRANSISTOR AND ITS MANUFACTURING METHOD

(75) Inventor: Mizuhisa Nihei, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/708,903

(22) Filed: Feb. 19, 2010

(65) Prior Publication Data

US 2010/0151662 A1     Jun. 17, 2010

Related U.S. Application Data

(60) Division of application No. 11/244,151, filed on Oct. 6, 2005, now Pat. No. 7,692,238, which is a continuation of application No. PCT/JP03/06379, filed on May 22, 2003.

(51) Int. Cl.
*H01L 21/336* (2006.01)
(52) U.S. Cl. .................. 438/268; 438/142; 438/197; 438/270; 257/E21.41; 257/328; 257/329; 257/330; 977/742; 977/938
(58) Field of Classification Search .......... 438/142, 438/197, 268, 270; 257/E21.41, 328–330; 977/742, 938
See application file for complete search history.

(56) References Cited

U.S. PATENT DOCUMENTS

| | | | |
|---|---|---|---|
| 5,644,147 | A | 7/1997 | Yamazaki et al. |
| 5,818,070 | A | 10/1998 | Yamazaki et al. |
| 5,994,735 | A | 11/1999 | Maeda et al. |
| 6,515,339 | B2 | 2/2003 | Shin et al. |

(Continued)

FOREIGN PATENT DOCUMENTS

JP     2-226762 A     9/1990

(Continued)

OTHER PUBLICATIONS

Won Bong Choi et al, "Ultrahigh-density nanotransistors by using selectively grown vertical carbon nanotubes", Applied Physics Letters, 2001 American Institue of Physics, vol. 79, No. 22, Nov. 26, 2001.

(Continued)

*Primary Examiner*—Matthew E Warren
*Assistant Examiner*—John Lin
(74) *Attorney, Agent, or Firm*—Westerman, Hattori, Daniels & Adrian, LLP

(57) ABSTRACT

The present invention is an object to provide a high-performance vertical field effect transistor having a microminiaturized structure in which the distance between the gate and the channel is made short not through a microfabrication process, having a large gate capacitance, and so elaborated that the gate can control the channel current with a low voltage, and a method for simply and efficiently manufacturing such a field effect transistor not through a complex process such as a microfabrication process. The field effect transistor of the present invention comprises a first electrode, a second electrode so arranged as to be electrically insulated from the first electrode, a semiconductive rod-shaped body extending through at least one of the first and second electrodes, provided along the inner wall of a hole in which the first and second electrodes are exposed, and interconnecting the first and second electrodes, and a third electrode at least partially inserted in the hole and opposed to the semiconductive rod-shaped body with an insulating layer interposed between the third electrode and the semiconductive rod-shaped body. The aspect preferably include an aspect in which the thickness of the insulating layer is 50 nm or less and an aspect in which the semiconductive rod-shaped body is a single-wall carbon nanotube.

3 Claims, 8 Drawing Sheets

U.S. PATENT DOCUMENTS

| | | |
|---|---|---|
| 6,576,943 B1 | 6/2003 | Ishii et al. |
| 6,740,910 B2 | 5/2004 | Roesner et al. |
| 7,115,916 B2 | 10/2006 | Avouris et al. |
| 2002/0145159 A1 | 10/2002 | Ishii et al. |
| 2002/0163079 A1 | 11/2002 | Awano |
| 2005/0205921 A1 | 9/2005 | Ishii et al. |
| 2006/0226551 A1 | 10/2006 | Awano |
| 2008/0111164 A1 | 5/2008 | Awano |

FOREIGN PATENT DOCUMENTS

| | | | |
|---|---|---|---|
| JP | 8-23100 A | 1/1996 | |
| JP | 2000-269457 A | 9/2000 | |
| JP | 2002-110977 A | 4/2002 | |
| JP | 2002-203969 A | 7/2002 | |
| JP | 2002-299238 A | 10/2002 | |
| JP | 2003-017508 A | 1/2003 | |
| JP | 2003-86796 A | 3/2003 | |
| JP | 2003-109974 A | 4/2003 | |

OTHER PUBLICATIONS

Japanese Office Action mailed Jun. 9, 2009, issued in corresponding Japanese Application No. 2004-572106.

FIELD EFFECT TRANSISTOR AND ITS
MANUFACTURING METHOD

CROSS-REFERENCE TO RELATED APPLICATIONS

This application is a division of U.S. application Ser. No. 11/244,151, filed on Oct. 6, 2005 which is a continuation of Application PCT/JP2003/006379, filed on May 22, 2003 the entire contents of which is incorporated herein by reference.

BACKGROUND OF THE INVENTION

1. Field of the Invention

This application relates to a high-performance vertical metal oxide film semiconductor field effect transistor (MOSFET: Metal Oxide Semiconductor Field Effect Transistor) and its manufacturing method using a field effect transistor, especially a carbon nanotube as a conductive channel.

2. Description of the Related Art

Studies to shorten the gate length of a transistor are actively carried out than before. At present, the shortest gate length is 8 nm in a MOS structure transistor manufactured by electron beam exposure. However, for this transistor, there are problems of large dimensional fluctuation of the gate, inferior linearity and not practical. There is a limit to the microfabrication of a transistor by the top-down method based on such Si technology and the development of new microfabrication technology is strongly desired.

On the other hand, as a break through for the microfabrication of a transistor by the top-down method based on Si technology, forming a field effect transistor (FET) by the bottom-up method using a microfabric carbon tube is proposed. The concerned field effect transistor is an element converting an input voltage signal in a gate electrode to an output current signal from a source electrode or a drain electrode, and based on the difference of the structure, it is roughly divided into a horizontal field effect transistor where a current moves parallel to a substrate surface and a vertical field effect transistor where a current moves vertically to a substrate surface. Of these, in the case of the concerned vertical field effect transistor, one side of the main electrode is on the bottom side of the transistor element and excels in conducting ability per unit area in comparison with the horizontal field effect transistor, and according to the laminate thickness, the gate length is determined, therefore, there are advantages such as the controlling and microfabrication of the gate length at several nm level by layer laminated process is possible. Recently, vertical field effect transistor using carbon nanotube excelling in properties such as chemical stability, electric conductivity, electron emission ability, mechanical strength, or thermal conductivity in gate electrode and conductive channel is proposed (for example, *Applied Physics Letters*, vol. 79, p. 3696, 2001 and Japanese Patent Application Laid-Open (JP-A) No. 2002-110977). Specifically, as shown in FIGS. 1A to 1C, a vertical field effect transistor (FET) where multi-hole 65 is tessellated formed on insulating layer 60 comprising of alumina or silicon, carbon nanotube 20 is developed inside hole 65 in a vertical direction, drain electrode line 80 and source electrode line 90 are linked respectively to the upper part and lower part of the insulating layer 60 with the carbon nanotube 20, and gate electrode line 70 is provided in the upper part of the drain electrode line 80, is proposed.

However, in this case, the carbon nanotube used as the conductive channel is a multi-layer carbon nanotube of comparatively big diameter formed one tube by one tube inside the hole of the insulating layer, and for the concerned multi-layer carbon nanotube, the electrical property of each layer differs and materials that have metal property and materials that have semiconductive property mix together, therefore, there is a problem of not performing sufficiently the semiconductive controlling, that is, the channel current controlling by the gate electrode. The gate electrode controlling the current of the conductive channel is formed at a position apart from the carbon nanotube on the drain electrode, therefore, there are problems such as the distance between the gate electrode and the conductive channel (carbon nanotube) is big, the gate capacity necessary during modulating of channel current is not sufficient, and sufficient device performance can not be obtained.

A field effect transistor where the distance between the conductive channel (carbon nanotube) and the gate electrode is shortened is also proposed (for example, Japanese Patent Application Laid-Open (JP-A) No. 2003-109974). However, in this case, as the gate spacing and channel spacing are determined by patterning method, due to the fluctuation of the patterning, there are problems such as the gate spacing and channel spacing also fluctuate and the controlling of the channel current becomes insufficient.

Thus, the present situation is that a high-performance vertical field effect transistor where the distance between the gate electrode and conductive channel is small and capable of performing sufficiently channel current controlling by a gate, and a method effectively manufacturing the field effect transistor, are not yet provided.

Under these circumstances, the present invention has been accomplished, and the objects of the present invention are as follows. Specifically, an object of the present invention is to provide a high-performance vertical field effect transistor having a microminiaturized structure in which the distance between the gate and the channel is made short not through a microfabrication process, having a large gate capacitance, and so elaborated that the gate can control the channel current with a low voltage, and a method for simply and efficiently manufacturing such a field effect transistor not through a complex process such as a microfabrication process.

SUMMARY OF THE INVENTION

The field effect transistor of the present invention comprises a first electrode, a second electrode so arranged as to be electrically insulated from the first electrode, a semiconductive rod-shaped body extending entirely through at least one of the first and second electrodes, provided along the inner wall of a hole in which the first and second electrodes are exposed, and interconnecting the first and second electrodes, and a third electrode at least partially inserted in the hole and opposed to the semiconductive rod-shaped body with an insulating layer interposed between the third electrode and the semiconductive rod-shaped body.

For the field effect transistor, one of the first and second electrodes functions as a source electrode, the other functions as a drain electrode, and the third electrode functions as a gate electrode. The semiconductive rod-shaped body interconnecting the first and second electrodes functions as a conductive channel. This conductive channel is arranged opposite to the gate electrode through the insulating layer. For the field effect transistor, when a thickness of the insulating layer is controlled thinly, it can easily microminiature shortly the distance between the gate and the channel without using the semiconductor microfabrication technology, the gate capacity of the field effect transistor is increased, the device performance is increased largely, and when the number of the semiconductive rod-shaped body is controlled, the device current can be controlled as desired.

The field effect transistor of the present invention is a manufacturing method of the field effect transistor of the present invention, forms a hole exposing the first and second electrodes arranged through the insulating layer, and comprises a semiconductive rod-shaped body formation process forming a semiconductive rod-shaped body along the inner wall of the hole and interconnecting the first and second electrodes, an insulating layer coating process coating an insulating layer on the exposed surface of the hole forming the semiconductive rod-shaped body, and an electrode forming process of a third electrode forming the third electrode so as to bury the hole coated on the insulating layer.

For the semiconductive rod-shaped body formation process, a hole exposing the first and second electrodes arranged through the insulating layer is formed, and a semiconductive rod-shaped body is formed along the inner wall of the hole and the first and second electrodes are interconnected. For the insulating layer coating process, an insulating layer is coated on the exposed surface of the hole forming the semiconductive rod-shaped body. For the electrode forming process of a third electrode, a third electrode so as to bury the hole coated on the insulating layer is formed. For the insulating layer coating process, a thickness of the insulating layer is made thin and by forming the third electrode, the distance between the semiconductive rod-shaped body and the third electrode can be shorten, and the distance between the gate and the channel can be microminiatured shortly without using the semiconductor microfabrication technology. According to the above, a high-performance field effect transistor of the present invention is manufactured.

BRIEF DESCRIPTION OF THE DRAWINGS

FIG. 5A is a schematic explanatory view showing a state where a laminated structure comprising a first and second electrode arranged on a substrate through an insulating layer is formed in a semiconductive rod-shaped body formation process. FIG. 5B is a schematic explanatory view showing a state where a hole exposing the first and second electrodes arranged through the insulating layer in the laminated structure is formed in a semiconductive rod-shaped body formation process. FIG. 5C is a schematic explanatory view showing a state where along the inner wall of the hole, a carbon nanotube as a semiconductive rod-shaped body is formed and the first and second electrodes are interconnected in a semiconductive rod-shaped body formation process. FIG. 5D is a schematic explanatory view showing a state where the carbon nanotube and, the first and second electrodes are ohmic contacted by heat treatment. FIG. 5E is a schematic explanatory view showing a state where the semiconductive rod-shaped body coats the insulating layer on the exposed surface of the formed hole in an insulating layer coating process. FIG. 5F is a schematic explanatory view showing a state where a third electrode is formed so as to bury the hole coated on the insulating layer in an electrode forming process of a third electrode.

FIG. 6A is a schematic explanatory view showing a state where a laminated structure comprising a first and second electrode arranged on a substrate through an insulating layer is formed in a semiconductive rod-shaped body formation process. FIG. 6B is a schematic explanatory view showing a state where a hole exposing the first and second electrodes arranged through the insulating layer in the laminated structure is formed in a semiconductive rod-shaped body formation process. FIG. 6C is a schematic explanatory view showing a state where a center section excluding the margin of a metal layer exposed circularly due to the hole forming is coated with a material layer in the first electrode FIG. 6D is a schematic explanatory view showing a state where along the inner wall of the hole, a carbon nanotube as a semiconductive rod-shaped body is formed and the first and second electrodes are interconnected in a semiconductive rod-shaped body formation process. FIG. 6E is a schematic explanatory view showing a state where the carbon nanotube and, the first and second electrodes are ohmic contacted by heat treatment. FIG. 6F is a schematic explanatory view showing a state where the semiconductive rod-shaped body coats the insulating layer on the exposed surface of the formed hole in an insulating layer coating process and in an electrode forming process of a third electrode, a third electrode is formed so as to bury the hole coated on the insulating layer.

DESCRIPTION OF THE PREFERRED EMBODIMENTS

Field Effect Transistor

Figure 1A:
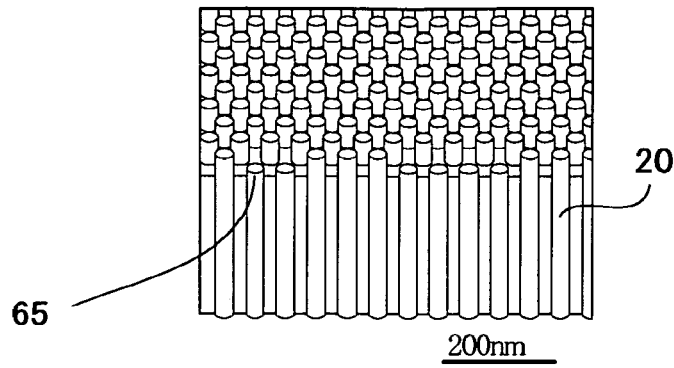
FIG. 1A is an explanatory view showing a carbon nanotube growing vertically inside a hole in an insulating layer.
Figure 1B:
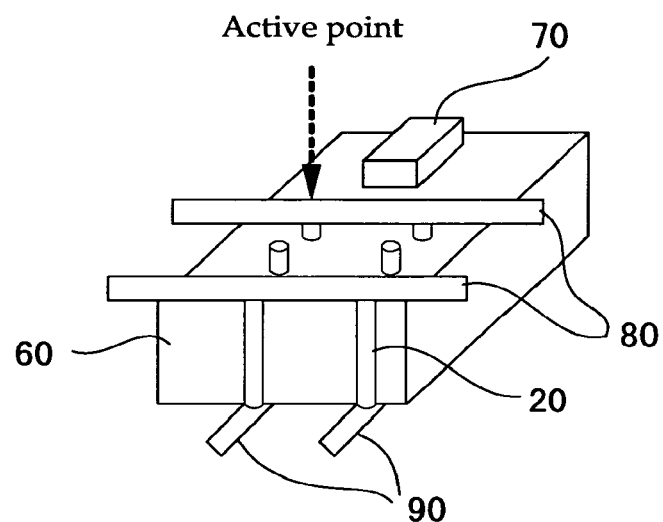
FIG. 1B is a schematic explanatory view showing a vertical field effect transistor in the past.
Figure 1C:
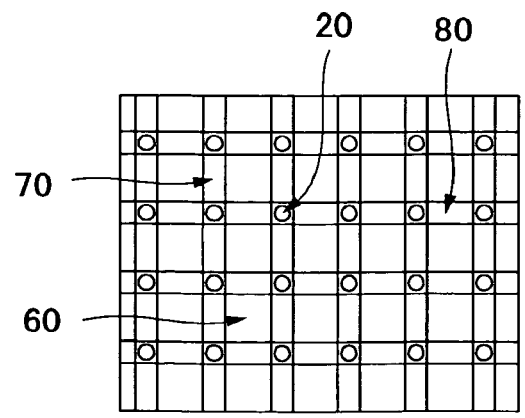
FIG. 1C is a section diagram showing an arrangement of a source electrode and a drain electrode, and a carbon nanotube.

A field effect transistor of the present invention comprises a first electrode, a second electrode, a semiconductive rod-shaped body, a third electrode, and further, according to necessity, comprises other materials.

-First electrode-

The first electrode can have any suitable shape, structure, material, thickness and size, and has no particular limitation and can be suitably selected from the widely known electrodes according to the purpose. The concerned first electrode can be functioned as a source electrode in the field effect transistor.

The shape, for example, a plate-shape is suitable.

The structure can be a single-layer structure or a laminated structure, however, as the laminated structure can form easily an ohmic contact with the semiconductive rod-shaped body, it is preferable. The laminated structure, for example, is preferably a structure where a material layer capable of reacting with the semiconductive rod-shaped body on a metal layer is formed.

The material, as a material of the metal layer in the case of the first electrode comprising the laminated structure, has no particular limitation and can be suitably selected from the materials widely known as electrode materials, for example, a metal is suitable. Of these, catalyst metal used in the extension of the semiconductive rod-shaped body is preferable. In this case, it is advantageous because it can grow and form the carbon nanotube on the first electrode.

A material of the catalyst metal has no particular limitation and can be suitably selected from the widely known electrodes according to the purpose; for example, a transition metal or a transition-metal compound or an alloy of transition metal is suitable.

The transition metal, for example, can be Al, Ti, V, Cr, Mn, Fe, Ni, Co, Cu, Zn, Zr, Mo, Ru, Rh, Pd, Ag, Cd, In, Sn, Sb, W, Re, Os, Ir, or Pt. These can be used independently or as a combination of two elements or more. Of these, Fe, Co, Al, Ni, Mn, Pd, Cr, or Pt are preferable from the point that they have high catalytic activity, and Ni (nickel), Fe (ferrum), or Co (cobalt) are preferable from the point that they manufacture single-layer carbon nanotube.

The transition-metal compound, for example, can be an oxide of the transition metal, a halide of the transition metal, a hydroxide of the transition metal, a sulfate of the transition metal, or a nitrate of the transition metal. These can be used independently or as a combination of two elements or more.

The alloy of transition metal, for example, can be an alloy of any two elements or more of the transition metal, or an alloy comprising of at least an element selected from the transition metal and at least an element of other metals.

A material of the material layer has no particular limitation and can be suitably selected from the widely known materials according to the purpose; however, material that is capable of reacting with the semiconductive rod-shaped body is preferable. In this case, when heat treatment is performed in the state of the semiconductive rod-shaped body in the material layer, it is advantageous that at the contact part of the material layer and the semiconductive rod-shaped body, a compound of an element comprising of the semiconductive rod-shaped body and a material comprising the material layer is formed and the semiconductive rod-shaped body and the first electrode can be ohmic contacted.

As for specific examples of the material of the material layer, Ti (titanium), Si (silicon), Nb (niobium), or C (carbon) are suitable. When the semiconductive rod-shaped body is a carbon nanotube, at the contact part with the carbon nanotube by the above-mentioned heat treatment, the material, if it is a Ti, TiC is formed, if it is a Si, SiC is formed, if it is a C, graphite carbon is formed, and the carbon nanotube and the first electrode are connected firmly by ohmic contacting.

The thickness has no particular limitation and can be suitably selected according to the purpose. It is preferably 20 nm to 300 nm, and more preferably 50 nm to 120 nm. When the thickness is less than 20 nm, the semiconductive rod-shaped body (carbon nanotube) does not grow, and when it is more than 300 nm, the semiconductive rod-shaped body (carbon nanotube) and the first electrode do not ohmic contact.

When the first electrode comprises of the laminated structure, a thickness of the metal layer, for example, is preferably 20 nm to 100 nm and more preferably 5 nm to 20 nm, and a thickness of the material layer, for example, is preferably 20 nm to 200 nm and more preferably 50 nm to 100 nm.

When the thickness of the metal layer is outside the range of the above-mentioned numerical value, the semiconductive rod-shaped body (carbon nanotube) cannot be grown sufficiently and if the thickness of the material layer is outside the range of the above-mentioned numerical value, the first electrode and the semiconductive rod-shaped body cannot be ohmic contacted.

The first electrode can be formed on a substrate. When the first electrode comprises of the laminated structure, it is preferable to be formed on the substrate in the order of the metal layer and the material layer.

The substrate can have any suitable shape, structure and size, has no particular limitation and can be suitably selected according to the purpose, and the shape, for example, can be a flat-plate shape, the structure can be a single-layer structure or a laminated structure and the size can be suitably selected according to the size of the upper electrode and lower electrode.

The substrate, for example, can be a substrate formed by inorganic material or a substrate formed by organic material.

The substrate formed by the inorganic material, for example, can be a glass substrate, a crystal substrate, a silicon substrate, a silicon oxide substrate, an aluminum oxide substrate, or a $SiO_2$ layer-coated silicon substrate.

The substrate formed by the organic material, for example, can be a polyethylene terephthalate substrate, a polycarbonate substrate, a polystyrene substrate, or a polymethyl methacrylate substrate.

These can be can be used independently or as a combination of two elements or more. Of these, glass substrate, crystal substrate, and silicon substrate are preferable.

The substrate can be a suitably synthesized substrate, or can be a commercial product.

The thickness of the substrate has no particular limitation, can be suitably selected according to the purpose, and preferably 100 μm to 2000 μm, and more preferably 500 μm to 700 μm.

If the thickness of the substrate is less than 100 μm, the mechanical strength is weak, and if the thickness of the substrate is more than 2000 μm, thermal conductivity deteriorates and the growth defect of the semiconductive rod-shaped body (carbon nanotube) occurs.

The surface of the substrate is preferably flat.

The forming method of the first electrode has no particular limitation and can be suitably selected from the widely known methods according to the purpose, for example, coating method, plating method, printing method, sputtering method, CVD method, or vapor deposition method. When the first electrode comprises of the laminated structure, the same methods are suitable as the forming method of the metal layer and the material layer. After the first electrode is formed, annealing treatment can be suitably performed.

-Second Electrode-

The second electrode can have any suitable shape, structure, material, thickness and size, and has no particular limitation, can be suitably selected from the widely known electrodes according to the purpose and can be the same as the first electrode. The second electrode can differ from the first electrode or can be the same. The second electrode can be functioned as a drain electrode in the field effect transistor.

On the second electrode, or on the metal layer when the second electrode comprises of the laminated structure the same as the first electrode, the substrate or an insulating layer mentioned later can be provided. In this case, it is preferable because the material layer capable of reacting with the semiconductive rod-shaped body in the second electrode, through an insulating layer mentioned later can be designed to an electrically insulated state where one surface of the material layer becomes the substrate and the other surface becomes the substrate or the insulating layer in the field effect transistor arranged opposite to the material layer in the first electrode.

The second electrode is preferably arranged through an insulating layer, though it is arranged in an electrically insulated state as compared with the first electrode.

The insulating layer can have any suitable shape, structure, material, thickness and size, and has no particular limitation, can be suitably selected according to the purpose.

The shape, for example, a plate-shape is suitable.

The structure, for example, can be a single-layer structure or a laminated structure.

The material, for example, can be an inorganic material or an organic material.

The inorganic material, for example, can be an oxide, a nitride, or a fluoride. The oxide, for example, can be a silicon oxide, an aluminum oxide, or titanium oxide. The nitride, for example, can be a silicon nitride. The fluoride, for example, for example, can be a calcium fluoride.

The organic material, for example, is preferably a polymer, and can be an acrylic resin, an epoxy resin, a polyimide, or a polytetrafluoroethylene.

These can be can be used independently or as a combination of two elements or more. Of these, at least one element of an inorganic material selected from the oxide, nitride, or fluoride and a resist material is preferable, and silicon oxide ($SiO_2$) is more preferable.

The thickness has no particular limitation and can be suitably selected according to the purpose; for example, it is preferably 2 nm to 100 nm, and more preferably 3 nm to 20 nm.

When the thickness is less than 2 nm, gate leak current increases and property deteriorates, and when it is more than 100 nm, conductive channel length becomes longer and controlling of the device current becomes difficult.

The forming method of the insulating layer has no particular limitation and can be suitably selected from the widely known methods according to the purpose, for example, vapor deposition method, or coating method of sputtering method, CVD method, or PVD method are suitable.

A configuration of the second electrode has no particular limitation and can be suitably selected according to the purpose, for example, preferably a configuration opposite to the first electrode through the insulating layer, and when the second electrode and the first electrode are laminated structure, a configuration where the material layers are opposite each other, is preferable.

-Semiconductive Rod-Shaped Body-

The semiconductive rod-shaped body functions as a conductive channel in the field effect transistor. This semiconductive rod-shaped body has no particular limitation and can be suitably selected from the widely known as long as it functions as a conductive channel, for example, a material formed by carbon element.

A material formed by the carbon element, for example, can be a carbon nanotube, or a carbon nanohorn. These can be used independently or as a combination of two elements or more. Of these, carbon nanotube is especially preferable.

The carbon nanotube is a carbon material and due to its chirality (twisting manner of tube or winding manner of graphite sheet), it has excellent properties such as the electric conductivity changes to semi-conductivity or metallic and shows thermal conductivity more than diamond, shows current density able to flow $10^6$ ampere per one square centimeter, high Young's modulus, or possibility of high occlusion effect of hydrogen.

This semiconductive rod-shaped body has no particular limitation and can be suitably selected according to the purpose, for example, a single-layer structure, or a laminated structure.

The single-layer structure can be a single-layer carbon nanotube (SWNT: Single Wall Nanotube) where the graphite sheet (two dimensional six-membered ring net of monatomic layer) is one layer only, and the laminated structure can be a multi-layer carbon nanotube (MWNT: Multi Wall Nanotube) comprising of multiple graphite sheets.

These can be used independently or as a combination of two elements or more. Of these, single-layer carbon nanotube is preferable because it shows semiconductive property.

The single-layer carbon nanotube comprises a structure where the graphite sheet connected in a hexagon shape is rounded to a tube shape by the strongest bond called $SP^2$ bond among carbon atoms and the axis of the carbon nanotube is closed by a few six-membered rings comprising of five-membered ring. This single-layer carbon nanotube is defined by three parameters of diameter, chiral angle (spiral angle), and spiral direction (right twist or left twist). Of these three parameters, especially due to the diameter and the chiral angle, it is known that a unique property where the metal phase and semiconductor phase are replaced is comprised.

Figure 2A:
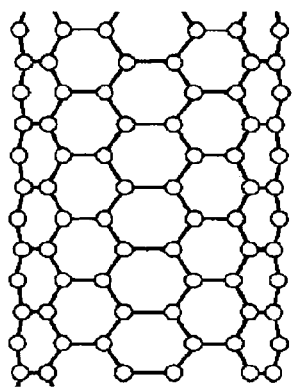
FIG. 2A is a section diagram showing a chirality of an armchair type carbon nanotube.
Figure 2B:
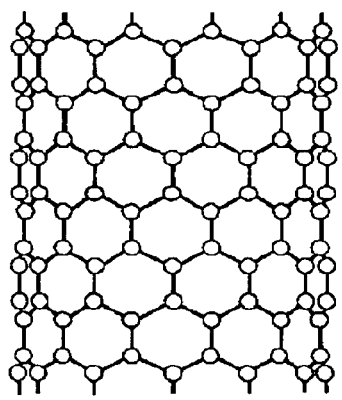
FIG. 2B is a section diagram showing a chirality of a zigzag type carbon nanotube.
Figure 2C:
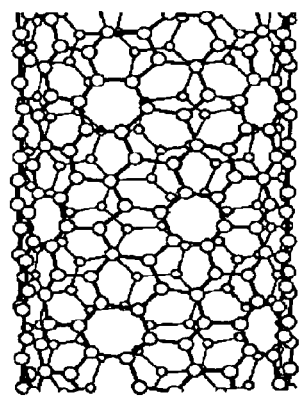
FIG. 2C is a section diagram showing a chirality of a chiral type carbon nanotube.

For the carbon nanotube, there are one type that has bonded structure satisfying the condition to show metallic property and another type that has bonded structure satisfying the condition to show semiconductive (submetallic) property. The chirality (twisting manner of the tube, or winding manner of the graphite sheet) participates in showing the metallic property or the semiconductive property of the carbon nanotube. For example, FIG. 2A shows the chirality of an armchair type carbon nanotube. This armchair type carbon nanotube is known to show metallic property. FIG. 2B shows the chirality of a zigzag type carbon nanotube. This zigzag type carbon nanotube is known to show semiconductive property. Further, FIG. 2C shows the chirality of a chiral type carbon nanotube. It is known that for this chiral type carbon nanotube, there is one that shows metallic property and one that shows semiconductive property according to condition.

Of these, in the present invention, one that shows the semiconductive property can be used as the semiconductive bar-like body, and as the one that shows the semiconductive property, any one of the zigzag type carbon nanotube or the chiral type carbon nanotube is suitable. In the case of the one showing the metallic property, the controlling of the channel current by the gate cannot be performed sufficiently. On the other hand, in the case of the one showing the semiconductive property, it is advantageous because there is no such thing.

For the chirality of the carbon nanotube, it is known that it is changed by the manufacturing method or manufacturing condition.

The conductivity of the semiconductive rod-shaped body, as long as it is semiconductive or conductive, has no particular limitation and can be suitably selected according to the purpose, however, it is preferable to be semiconductive because of the controlling of the channel current by the gate.

The semiconductive rod-shaped body is provided along the inner wall of the hole.

The hole, as long as it extending entirely through at least one of the first electrode and the second electrode and exposes the concerned first electrode and the second electrode, has no particular limitation and can be suitably selected according to the purpose for its shape, structure, size, or number.

The shape, for example, can be cylinder shape, or angular cylinder shape.

These can be used independently or as a combination of two or more. For the field effect transistor of the present invention, as it is preferable because of the controlling of the current, the semiconductive rod-shaped body is provided along the inner wall of the hole, further it has a structure where the third electrode functioning as the gate electrode is inserted in the hole, and the distance between the semiconductive rod-shaped body and the third electrode, if possible, short and constant, it is preferable that the inner wall of the hole is parallel with the forming direction of the semiconductive rod-shaped body, and especially preferable that the axis is a cylinder shape oriented in the forming direction of the semiconductive rod-shaped body.

The forming direction of the semiconductive rod-shaped body when the first electrode and the second electrode are opposed arranged is preferably almost orthogonal direction to the first electrode and the second electrode.

The structure can be capable of providing the semiconductive rod-shaped body along the inner wall of the hole and inserting the third electrode to the inner part, for example, a structure that extends entirely through at least one of the first electrode and the second electrode, however, it can be a structure that extends entirely through both the first electrode and second electrode, or a structure extends entirely through that one only. When the structure extending entirely through one electrode only, when the other one that is not extended entirely through comprises of the laminated structure, a structure where the entire or a part of the material layer is extended entirely through and removed, and the metal layer is exposed, is preferable. In this case, the other part is advantageous because it is capable of ohmic contacting the formed semiconductive rod-shaped body to the material layer and the exposed metal layer where the material layer is removed. At this time, the shape of the exposed metal layer can be the same as the shape of an opening of the hole, or can be different. In the case of the former, when the hole is a cylinder shape, a circular form, or when it is an angular cylinder shape, an angular form, is preferable. In the case of the latter, a round shape having a shape and diameter almost the same as the shape of an opening of the hole, for example, when the hole is a cylinder shape, a circular form, or when it is an angular cylinder shape, an angular circle form, is preferable.

The size can be suitably selected according to the control value of the device current, and when the diameter of the opening of the hole becomes bigger, the diameter of the third electrode inserted to the hole becomes bigger and the current value capable of controlling becomes bigger, for example, the diameter of the opening (the biggest diameter when the shape of the opening is other than a circular shape) is preferably 0.1 µm to 5 µm, and more preferably 1 µm to 2 µm.

When the diameter of the opening as the size is less than 0.1 µm, lithography becomes difficult, and when it is more than 5 µm, it is too big as the current value.

The number can be suitably selected according to the device current value being controlled, and can be 1, or 2 or more.

In the inner wall of the hole, in the case where the first electrode, the insulating layer and the second electrode are exposed, and only one end of the hole opens, for example, the first electrode (when the first electrode is the laminated structure, only the metal layer) as the bottom is exposed in the hole, and in the inner wall, (when the first electrode is the laminated structure, the material layer) in the case where the insulating layer and the second electrode (when the second electrode is the laminated structure, the material layer and the metal layer) are exposed, and both ends of the hole open, for example, the first electrode (when the first electrode is the laminated structure, the material layer and the metal layer), the insulating layer and the second electrode (when the second electrode is the laminated structure, the material layer and the metal layer) are exposed.

On the inner wall of the hole, there can be a bump or without it. In the case of the former, for example, it can be a state where both ends of the hole open, the first electrode and the first electrode are the laminated structure, and the metal layer of the first electrode and the metal layer of the second electrode protrude more into the inner part of the hole than other layers. In the case of this state, it is advantageous because the carbon nanotube can be stretched formed between metal layer, and the material layer in the first electrode and the material layer in the second electrode can be contacted to the carbon nanotube, and the carbon nanotube can be stretched formed along the inner wall of the hole.

The forming of the hole has no particular limitation and can be performed according to the suitably selected methods from widely known hole forming technology, or pattern forming technology, for example, after laminated forming the first electrode, the insulating layer and the second electrode by vapor deposition method or coating method, it can be performed by removing selectively these by etching method or sputtering method.

The semiconductive rod-shaped body is provided along the inner wall of the wall, however, it is preferable that the direction is almost orthogonal direction to the first electrode and the second electrode that are arranged opposite to each other.

The diameter of the semiconductive rod-shaped body has no particular limitation and can be suitably selected according to the purpose, for example, it is preferably 20 nm or less, and more preferably 0.4 nm to 1.5 nm.

If the diameter is less than 0.4 nm, the mechanical strength becomes insufficient, and when it is more than 20 nm, the property of semiconductivity is lost.

The length of the semiconductive rod-shaped body, for example, is preferably 50 nm to 500 nm.

If the length is less than 50 nm, leak current between the source and drain becomes bigger and the device performance deteriorates, and when it is more than 500 nm, the conductive channel length becomes longer and the device property deteriorates.

The number of the semiconductive rod-shaped body has no particular limitation and can be suitably selected according to the demanded device current value.

When the number of the semiconductive rod-shaped body is plural, the semiconductive rod-shaped body is preferable to be arranged almost equal space.

The semiconductive rod-shaped body is provided along the inner wall of the hole, in other words, arranged in the surrounding of the third electrode, and interconnects the first electrode and the second electrodes, and at this time, from the point of the device performance, this semiconductive rod-shaped body is preferably ohmic contacted with the first and second electrodes, and when the first and second electrodes comprise of the laminated structure, this semiconductive rod-shaped body is more preferably ohmic contacted with the metal layer and the material layer of the first electrode and ohmic contacted with the metal layer and the material layer of the second electrode.

The forming method of the semiconductive rod-shaped body has no particular limitation and can be suitably selected from the widely known methods according to the purpose, for example, vapor deposition method. When the semiconductive rod-shaped body is the carbon nanotube, the forming method of the carbon nanotube coating method, for example, can be CVD method (chemical vapor deposition), PVD (physical vapor deposition), and of these, CVD method is preferable.

The CVD method has no particular limitation and can be suitably selected from the widely known methods according to the purpose, for example, plasma CVD method, thermal CVD method, hot filament thermal CVD method, or DC plasma hot filament CVD method.

When performing the CVD method, it is advantageous because when at least the material from one of the first electrode or second electrode is formed by catalyst metal that is the manufacturing catalyst of the carbon nanotube, one of the first electrode and second electrode can be used as the manufacturing substrate of carbon nanotube. In this case, the diameter and the number of the carbon nanotube formed according to the polycrystalline state of the catalyst metal can be controlled. And in this case, it is advantageous because in between the first electrode and second electrode, namely in the almost orthogonal direction of both electrodes, when the CVD method is performed by applying direct current field, the semiconductive rod-shaped body can be formed in the almost orthogonal direction of both electrodes.

-Third Electrode-

The third electrode can have any suitable shape, structure, material, thickness and size, and has no particular limitation and can be suitably selected according to the purpose. The third electrode can be functioned as a gate electrode in the field effect transistor.

The shape can be suitably selected according to the shape of the hole, for example, the shape of the part inserted to the inside of the hole is preferably a shape having the circumference face of the shape almost equal to the inner wall of the hole, namely the shape of the circumference face, specifically, when the shape of the hole is a cylinder shape, the part inserted into the hole is preferably a cylindrical. The third electrode can be formed protruding from the inside of the hole to the outside, and in this case, can be further provided in an electrically insulated state until on the second electrode.

The material has no particular limitation and can be suitably selected from the widely known electrode materials, for example, gold, silver, platinum, titanium, Pt—Au alloy, titanium carbide, titanium nitride, tungsten, tungsten silicide, tungsten nitride, aluminum, molybdenum, chrome, or polycrystalline silicon. These can be used independently or as a combination of two elements or more. Of these, Pt—Au alloy is preferable.

The third electrode is arranged opposed to the semiconductive rod-shaped body with an insulating layer mentioned later interposed between the third electrode and the semiconductive rod-shaped body. The semiconductive rod-shaped body is arranged very near in the surrounding of the third electrode through the insulating layer.

The insulating layer can have any suitable shape, structure, material, thickness and size, and has no particular limitation and can be suitably selected according to the purpose. The insulating layer comprises of a function insulating the third electrode as the gate electrode and the semiconductive rod-shaped body as the conductive channel in the field effect transistor.

The material of the insulating layer, for example, can be inorganic material, organic material, or other materials.

The inorganic material, for example, can be an oxide, a nitride, or a fluoride. The oxide, for example, can be a silicon oxide, an aluminum oxide, or titanium oxide. The nitride, for example, can be a silicon nitride. The fluoride, for example, can be, for example, can be a calcium fluoride.

The organic material, for example, can be an acrylic resin, an epoxy resin, a polyimide, or a polytetrafluorethylene are suitable.

The other material, for example, can be a self-organizing molecule such as aminopropylethoxysilane.

These can be used independently or as a combination of two elements or more. Of these, at least one element of an inorganic material selected from the oxide, nitride, or fluoride is preferable, and silicon oxide ($SiO_2$) is more preferable.

The thickness of the insulating layer has no particular limitation and can be suitably selected according to the purpose, however, when the distance between the semiconductive rod-shaped body and the third electrode is shorten as short as possible, this corresponds to microminiature shortly the distance between the gate and the channel, and, as at low gate voltage, the device current can be easily controlled efficiently, it is preferably that the thickness is as thin as possible, specifically, preferably 200 nm or less, and more preferably 20 nm or less.

When the thickness of the insulating layer is more than 200 nm, in order to perform the controlling of the device current, large gate voltage is necessary.

The forming method of the insulating layer has no particular limitation and can be suitably selected from the widely known methods, for example, coating method, plating method, printing method, sputtering method, CVD method, or vapor deposition method. Of these, CVD method is preferable because the controlling to any shape and the controlling of the thickness is easy.

The forming method of the third electrode has no particular limitation and can be suitably selected from the widely known methods according to the purpose, for example, coating method, plating method, printing method, sputtering method, CVD method, or vapor deposition method. After forming the third electrode, suitable annealing treatment can be performed.

Figure 3A:
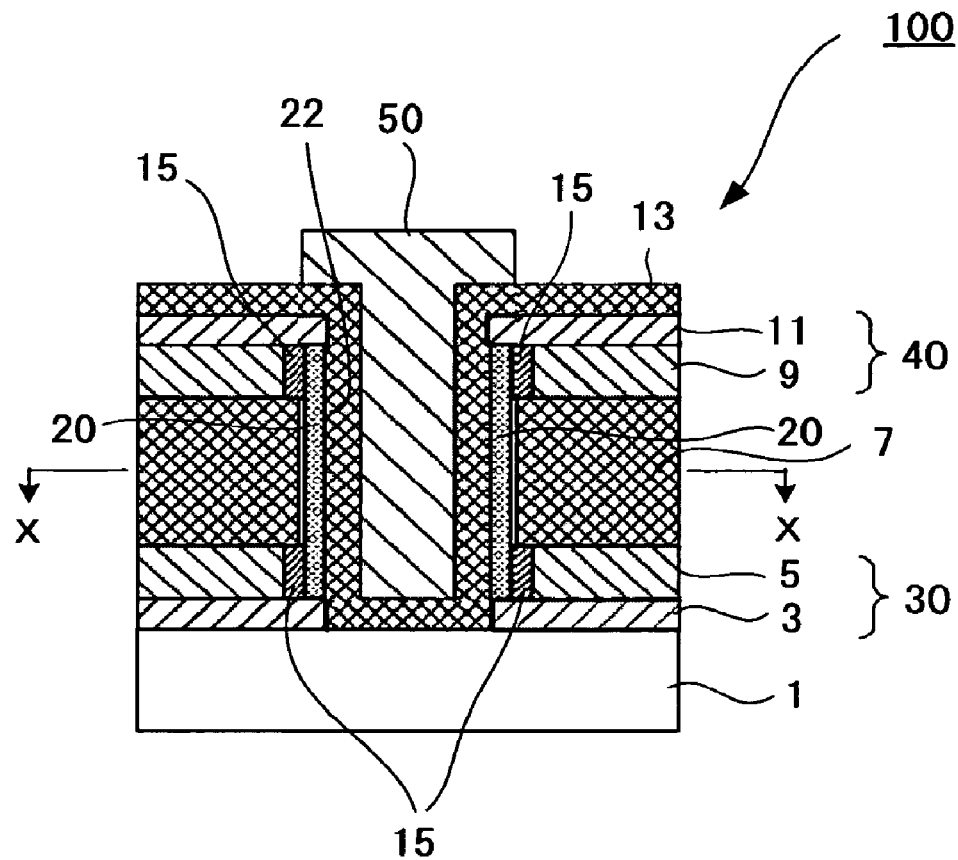
FIG. 3A is a cross section schematic explanatory view showing an example of a field effect transistor of the present invention.
Figure 3B:
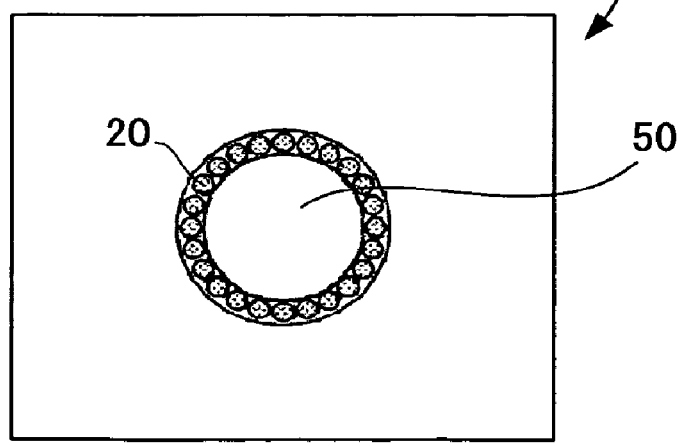
FIG. 3B is a partially abbreviated cross section view of FIG. 3A in a X-X direction.

The specific example of the field effect transistor of the present invention is described according to the figures. The field effect transistor 100 shown in FIG. 3A is a vertical field effect transistor. The field effect transistor 100 comprises of lower electrode 30 as the first electrode (source electrode), upper electrode 40 as the second electrode (drain electrode), and gate electrode 50 as the third electrode.

Lower electrode 30 is formed on substrate 1 and comprises of a laminated structure. The laminated structure is laminated and formed on the substrate 1 in the order of the catalyst metal layer 3 as the metal layer and the titanium layer 5 as the material layer.

Upper electrode 40 is formed on insulating layer 7 formed on titanium layer 5 of lower electrode 30 and is electrically insulated with lower electrode 30. Upper electrode 40 comprises of a laminated structure. The laminated structure is laminated and formed on the insulating layer 7 in the order of the titanium layer 9 as the material layer and the metal layer 11 as the metal layer.

Gate electrode 50 is arranged by inserting into the inside of hole 22.

Hole 22 is formed by penetrating through the laminated layer where catalyst metal layer 3, titanium layer 5, insulating layer 7, titanium layer 9 and metal layer 11 are laminated and formed on substrate 1. Specifically, for hole 22, facing the side of catalyst metal layer 3 from metal layer 11, the opening shape of metal layer 11 is a circular shape and the axis is formed into a cylinder shape arranged almost orthogonal direction with substrate 1. The bottom side of hole 22 is the surface of substrate 1 and in the inner wall, catalyst metal layer 3, titanium layer 5, insulating layer 7, titanium layer 9 and metal layer 11 are exposed in this order. In this inner wall, catalyst metal layer 3 and metal layer 11 are formed by protruding into the inside of hole 22 more than titanium layer 5, insulating layer 7 and titanium layer 9. On the exposed surface of catalyst metal layer 3 and metal layer 11 in the inner wall, carbon nanotube 20 as the semiconductive rod-shaped body is formed. Catalyst metal layer 3 and metal layer 11 are connected by carbon nanotube 20. One end of carbon nanotube 20 is contacted with catalyst metal layer 3 and the other end is contacted with metal layer 11, and the neighborhood of the one end is contacted with titanium layer 5 and on the contacted part, titanium carbide layer 15 is formed, and the neighborhood of the other one end is contacted with titanium layer 9 and on the contacted part, titanium carbide layer 15 is formed. Carbon nanotube 20 is ohmic contacted with lower electrode 30 and upper electrode 40. Carbon nanotube 20 is arranged along the exposed side of titanium layer 5, insulating layer 7 and titanium layer 9, and in an orthogonal direction with substrate 1.

Gate electrode 50 is arranged by inserting one part of it into hole 22 through insulating layer 13. Insulating layer 13 coats the inner wall and bottom side in hole 22, and the top of metal layer 11 which is the exposed surface of upper electrode 40. Gate electrode 50 is arranged so as to bury the inner space of hole 22 on the coated surface by insulating layer 13 in hole 22, and further, so as one end of metal layer 11 protrudes from hole 22 and forms T-shape cross section flange part. The shape of the part inserted into the inner part of hole 22 for gate electrode 50 is a cylindrical.

The field effect transistor 100, as shown in FIG. 3A, in the circumference of gate electrode 50, carbon nanotube 20 is adjoined and multiply arranged through insulating layer 22 formed in a very thin thickness.

Figure 4A:
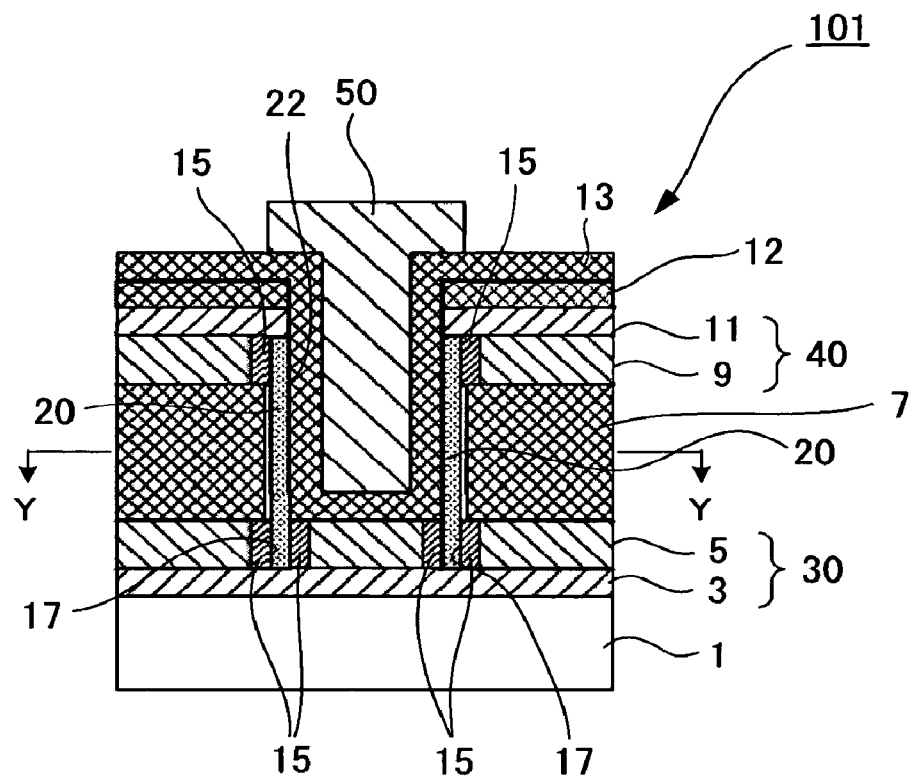
FIG. 4A is a cross section schematic explanatory view showing another example of a field effect transistor of the present invention.
Figure 4B:
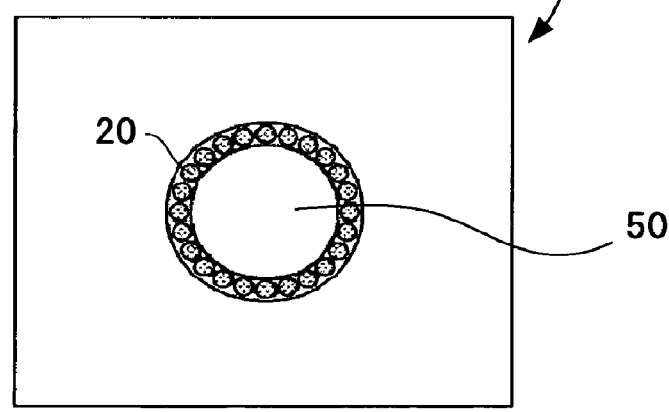
FIG. 4B is a partially abbreviated cross section view of FIG. 4A in a Y-Y direction

The field effect transistor 101 shown in FIG. 4A is different from the field effect transistor 100 shown in FIG. 3A only in the point that the bottom of hole 22 does not comprise of catalyst metal layer 3 only and only the circumference part comprises of catalyst metal layer 3, and the part excluding the circumference part comprises of titanium layer 5 formed in a circular shape. In other words, the field effect transistor 101 shown in FIG. 4A is different from the field effect transistor 100 shown in FIG. 3A in the point that circular shape titanium layer 5 is formed on the bottom of hole 22, and catalyst metal layer 3 exposes in a ring shape and ring shape groove 17 is formed. In the field effect transistor 101, one end of carbon nanotube 20 is contacted with titanium layer 5 exposing in the inner wall of the hole and circular shape titanium layer 5 formed on the bottom of hole 22, and in the contacted part, titanium carbide layer 15 is formed.

In the field effect transistor of the present invention, the semiconductive rod-shaped body as the conductive channel connecting the first electrode (source electrode) and the second electrode (drain electrode) is multiply arranged in the surrounding of the third electrode (gate electrode) through an insulating layer. As the semiconductive rod-shaped body and the third electrode (gate electrode) is provided inside the hole, according to the variations of the inner diameter of the hole, the number of the semiconductive rod-shaped body as the conductive channel can be easily fluctuated. Because of this, the channel current can be easily controlled by the third electrode (gate electrode) in the field effect transistor. By fluctuating the number of the semiconductive rod-shaped body, or, if necessary, further increasing the diameter of the part of the third electrode (gate electrode) inserted into the hole, the channel current value can be controlled easily and as desired. As a result, the field effect transistor can be used suitably as a design of semiconductor circuit. As the distance of the conductive channel and the third electrode (gate electrode) in the field effect transistor is very short, the channel current can be controlled with very low gate voltage and in comparison with the previous one, the gate capacity can be increased, and the device performance can be largely enhanced.

The field effect transistor of the present invention can be manufactured by suitably selected methods; however, it can especially be suitably manufactured by the following manufacturing method of the field effect transistor of the present invention.

(Manufacturing Method of Field Effect Transistor)

The manufacturing method of the field effect transistor of the present invention is the manufacturing method of the above-mentioned field effect transistor of the present invention, and comprises of a semiconductive rod-shaped body formation process, an insulating layer coating process, a third electrode forming process, and further, comprises of other process suitably selected according to necessity.

-Semiconductive Rod-Shaped Body Formation Process-

The semiconductive rod-shaped body formation process is a process forming the hole exposing the first electrode and the second electrode arranged through the insulating layer, forming a semiconductive rod-shaped body along the inner wall of the hole, and interconnecting the first electrode and second electrode.

The insulating layer, the first electrode, the second electrode, the hole, and the semiconductive rod-shaped body are as above-mentioned and the forming method of these is also as above-mentioned. The first electrode can be laminated formed on the substrate by vapor deposition method and at this time, the first electrode can be formed to the laminated structure and in this case, the metal layer and the material layer can be laminated on the substrate. The insulating layer can be laminated formed on the first electrode (when the first electrode comprising the laminated structure, the material layer) by vapor deposition method. The second electrode can be laminated formed on the insulating layer by vapor deposition method and at this time, the second electrode can be formed to the laminated structure and in this case, the material layer and the metal layer can be laminated formed on the insulating layer. The condition of the laminated forming of each of these layers has no particular limitation and can be suitably selected according to the purpose.

The hole, for example, can be formed after the first electrode, the insulating layer and the second electrode are laminated formed by vapor deposition method, and one part of this laminated structure is selectively removed by etching method and ion milling method.

The etching method has no particular limitation and can be suitably selected according to the purpose, for example, can be dry etching method, or wet etching method.

The wet etching method has no particular limitation and can be suitably selected from the widely known methods, and the treatment solution, for example, can be nitric acid solution, fluoric acid solution, combination of fluoric acid and nitric acid solution, or thermal phosphoric acid solution. The condition of the temperature and pressure of wet etching has no particular limitation and can be suitably selected from the widely known conditions.

The dry etching method has no particular limitation and can be suitably selected from the widely known methods, for example, can be reactive dry etching method, or chemical dry etching method. The gas for etching used during the dry etching has no particular limitation and can be suitably selected according to the purpose, for example, can be fluorine gas such as $CF_4$ gas, $CHF_3$ gas, or $C_4H_8$ gas. The condition of the temperature and pressure of dry etching has no particular limitation and can be suitably selected from the widely known conditions.

The ion milling method, also called ion beam etching, is an etching method producing ion by introducing inactive gas such as Kauffmann type, and this is passed through the grid, accelerated and collided to the sample substrate.

After the hole is formed, it is preferable to perform side-etching treatment to the hole. In this case, in the inner wall of the hall, the layer excluding the metal layer of the metal layer and the second electrode of the exposed first electrode, namely, only the material layer part of the material layer, the insulating layer, and the second electrode of the first electrode can be further etched and removed, and only the metal layer of the metal layer and the second electrode of the second electrode can be protruded into the inside of the hole. The side-etching treatment method can be the wet etching method, or dry etching method, and of these, dry etching method using fluorine gas is preferable.

As a result of the hole forming, a feedthrough hole is formed on only one side of the first electrode and the second electrode, namely when the first electrode is the lower electrode formed on the substrate, only on the second electrode as the upper electrode, and the other, namely the metal layer of the first electrode as the lower electrode is exposed. At this time, the shape of the exposed surface of the first electrode can be the same as the shape of an opening of the second electrode (upper electrode), or can be a round shape having a shape and diameter almost the same as the opening.

In the case of the latter, after the material layer of the first electrode (lower electrode) is once removed by the etching method, or lift-off method, the round shape material layer can be further reformed on the metal layer of the exposed first electrode, or during the etching, the material layer of the first electrode (lower electrode) can be formed to the round shape by removing one part of it. The condition of the etching has no particular limitation and can be suitably selected according to the purpose.

The forming method of the semiconductive rod-shaped body has no particular limitation and can be suitably selected from the widely known methods, for example, CVD method (chemical vapor growth method), or thermal decomposition method.

These methods can be used independently or as a combination of two elements or more. Of these, CVD method (chemical vapor growth method) is preferable because the carbon nanotube as the semiconductive rod-shaped body can be easily and effectively, and also stretched formed in an almost orthogonal direction with the substrate.

The CVD method (chemical vapor growth method) has no particular limitation and can be suitably selected from the widely known methods according to the purpose, for example, can be thermal CVD method (also merely called as CVD method), thermal filament CVD method, plasma CVD method (also called as plasma assisted CVD method, or plasma enhanced CVD method), DC plasma thermal filament CVD method, plasma enhanced hot filament CVD method, laser enhanced CVD method (also called as laser CVD). Of these, thermal CVD method is preferable.

The thermal CVD method grows the carbon nanotube by decomposing the material gas by the heat of the filament. When manufacturing the carbon nanotube by this thermal CVD method, an example of the condition is the temperature of the filament is 500° C. to 2000° C., the material gas is a gas mixture of acetylene and hydrogen (for example, introduced into the vacuum chamber with flow rate of 80 sccm and 20 sccm, respectively), the pressure 200 Pa, and the substrate temperature 900° C.

The thermal filament CVD method grows the carbon nanotube by performing gas decomposition by the thermal filament. In this case, an example of the reaction condition is the reaction gas, a gas mixture of acetylene and hydrogen is introduced into the vacuum chamber with flow rate of 80 sccm and 20 sccm, respectively, the pressure 1000 Pa, the substrate temperature 600° C., and the temperature of the thermal filament is 1800° C.

The plasma CVD method grows the carbon nanotube by decomposing the material gas by the plasma. For the excitation of the plasma, generally, radiofrequency (RF) is suitably used, however, low frequency, microwave, or direct current (DC) can be used, and the output of the radiofrequency (RF) is 0.1 $W/cm^3$ to 1000 $W/cm^3$.

The DC plasma thermal filament CVD method is a method combining direct current (DC) plasma and thermal filament. In this case, an example of the reaction condition is the reaction gas, a gas mixture of acetylene and hydrogen is introduced into the vacuum chamber with flow rate of 80 sccm and 20 sccm, respectively, the pressure 1000 Pa, the substrate temperature 600° C., and the temperature of the thermal filament is 1800° C. In order to vertically orientating (orientating in an orthogonal direction) the carbon nanotube to the substrate, direct current (DC) field of minus 400V as compared to the chamber (earth) is preferably applied to the substrate.

The condition of the CVD method has no particular limitation and can be the same condition as the manufacturing condition of the carbon nanotube by the CVD method.

In the case of CVD method, it is preferable to control the flow rate of the material gas and a gas mixture of carbon supply gas and installation gas as the material gas is suitably used.

The carbon supply gas has no particular limitation and can be suitably selected according to the purpose, for example, methane, ethylene, acetylene, benzene, butane, isopropanol, $C_{10}H_{16}$, $CS_2$, or $C_{60}$.

The installation gas has no particular limitation and can be suitably selected according to the purpose, for example, hydrogen or $NH_3$.

The rate of mixing of the carbon supply gas and the installation gas of the gas mixture has no particular limitation and can be suitably selected according to the purpose, for example, when methane gas is used as the carbon supply gas and hydrogen gas is used as the installation gas, the ratio of the flow rate is preferably methane gas:hydrogen gas=1 to 5: 9 to 5.

In the case of the CVD method, it is preferable to control the pressure of the vacuum chamber, and the pressure of the vacuum chamber, for example, is preferably 1 Torr to 10 Torr (100 Pa to 1000 Pa).

In the case of performing the CVD method, it is preferable that between the first electrode and the second electrode, direct field is applied. In this case, it is advantageous because the semiconductive rod-shaped body can be stretched formed along the application direction of the direct current field, namely, along the opposite direction of the first electrode and the second electrode.

For the semiconductive rod-shaped body formation process, after the semiconductive rod-shaped body is formed, heating treatment can be performed.

The condition of the heating treatment has no particular limitation and the temperature, time, and atmosphere can be suitably selected according to the purpose, for example, for the temperature and the time, it is preferably at 400° C. or more, 5 minutes or more, and more preferably at 600° C. to 800° C., 5 minutes or more, and for the atmosphere, inactive atmosphere or pressure reducing atmosphere such as nitrogen, or argon is preferable.

When the heating treatment is performed, it is preferable because the semiconductive rod-shaped body reacts with the material layer of the first electrode (for example, titanium layer, silicon layer, carbon layer) and the material layer of the second electrode (for example, titanium layer, silicon layer, carbon layer), and in the contacted part of both, for example, TiC layer, SiC layer and graphite carbon layer can be formed, the semiconductive rod-shaped body can be ohmic contacted with the first electrode and the second electrode and firmly connected to one another, and the device performance can be enhanced.

-Insulating Layer Coating Process-

The insulating layer coating process is a process coating an insulating layer on the exposed surface of the hole forming the semiconductive rod-shaped body. This insulating layer coating process can be performed suitably after the semiconductive rod-shaped body formation process.

The coating method of the insulating layer has no particular limitation and can be suitably selected from the widely known methods, for example, can be coating method, plating method, printing method, sputtering method, CVD method, or vapor deposition method. Of these, CVD method is preferable because the controlling to any shape and the controlling of the thickness is easy.

-Third Electrode Forming Process-

The third electrode forming process is a process forming a third electrode so as to bury the hole coated on the insulating layer. This third electrode forming process can be performed suitably after the insulating layer coating process.

The forming method of the third electrode has no particular limitation and can be formed by suitably selected methods according to the purpose, for example, coating method, plating method, printing method, sputtering method, CVD method, vapor deposition method, patterning method using resist, or vapor deposition and lift-off method.

In the manufacturing method of the field effect transistor of the present invention, for the insulating layer coating process, a thickness of the insulating layer is made thin and the third electrode can be formed, the distance between the semiconductive rod-shaped body and the third electrode can be shorten, and the distance between the gate and the channel can be microminiatured shortly without using the semiconductor microfabrication technology. As a result, according to the manufacturing method of the field effect transistor of the present invention, the field effect transistor of the present invention can be very simply and efficiently manufactured.

Hereafter, the field effect transistor of the present invention and its manufacturing method will be described referring to specific examples; however, the present invention is not limited to the disclosed examples.

EXAMPLE 1

FIGS. 5A to 5F are process drawings for describing a manufacturing process of a field effect transistor of the present invention.

Figure 5A:
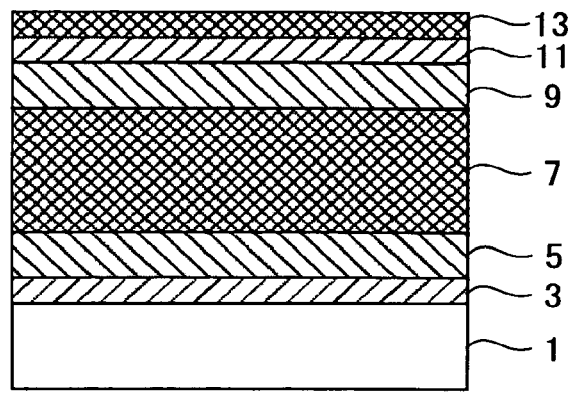
FIGS. 5A to 5F are process drawings for describing an example of a manufacturing process of a field effect transistor of the present invention.

Firstly, as shown in FIG. 5A, catalyst metal layer 3 (Fe layer) as the metal layer is formed to a thickness of 10 nm on substrate 1 (Si substrate) by sputtering method. On catalyst metal layer 3 (Fe layer), titanium layer 5 as the material layer is laminated formed to a thickness of 100 nm by sputtering method. Catalyst metal layer 3 (Fe layer) and titanium layer 5 comprise a lower electrode as the first electrode. On titanium layer 5, insulating layer 7 ($SiO_2$ insulating film) is laminated formed to a thickness of 200 nm by sputtering method. On insulating layer 7, titanium layer 9 as the material layer is laminated formed to a thickness of 100 nm by sputtering method. On titanium layer 9, metal layer 11 (Fe layer) is formed to a thickness of 10 nm by sputtering method. Titanium layer 9 and metal layer 11 (Fe layer) comprise an upper electrode as the second electrode. Further, on metal layer 11 (Fe layer), $SiO_2$ as insulating layer 13 is laminated formed to a thickness of 50 nm by sputtering method.

Figure 5B:
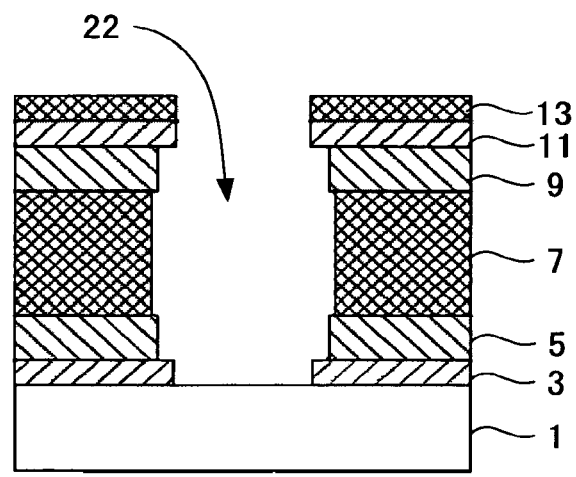

Next, as shown in FIG. 5B, hole 22 is formed to the laminated structure formed according to the above-mentioned. Namely, a region of one part of the laminated structure is patterned by widely known methods using resist and is selectively removed until the surface of substrate 1 is exposes using ion milling method. Next, by dry etching method using fluorine gas, side-etching is performed so that the diameter of the inner wall of hole 22 becomes bigger than the opening size of hole 22, only titanium layer 5, insulating layer 7 and titanium layer 9 are removed, and catalyst metal layer 3 and metal layer 11 are made protruded into the inside of hole 22 more than these layers. The opening diameter of hole 22 formed like this is 2 μm.

Figure 5C:
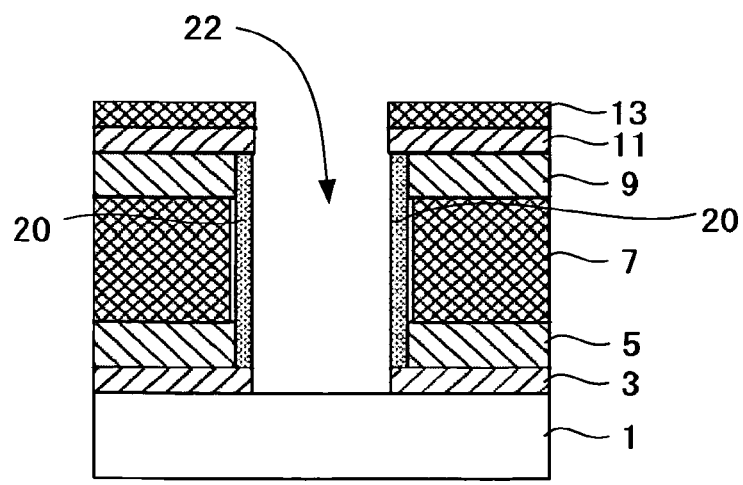

Next, as shown in FIG. 5C, inside hole 22, when the exposed part of catalyst metal layer 3 and metal layer 11 are catalyst for manufacturing, carbon nanotube 20 is stretched formed by thermal CVD method, and catalyst metal layer 3 and metal layer 11 are connected by carbon nanotube 20. This thermal CVD method is performed by introducing a gas mixture of acetylene 80 sccm and hydrogen 20 sccm as the reaction gas into the vacuum chamber at a condition of pressure 200 Pa and substrate temperature 900° C. As a result, by the observation by SEM, 500 tubes of single layer carbon nanotube of diameter 1.3 nm arranging in a circular shape along the inner wall of hole 22 are confirmed.

Figure 5D:
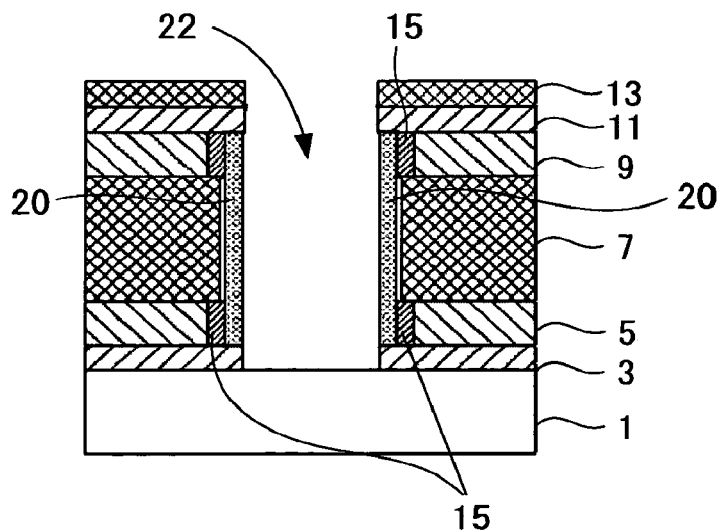

Next, as shown in FIG. 5D, by performing an hour heating treatment at 800° C. in a vacuum, carbon nanotube 20 reacts in the contacted part of titanium layer 5 and titanium layer 9, and TiC layer 15 is formed in the contacted part. As a result, carbon nanotube 20 can be ohmic contacted with the upper electrode and the lower electrode. The above-mentioned is the semiconductive rod-shaped body formation process.

Figure 5E:
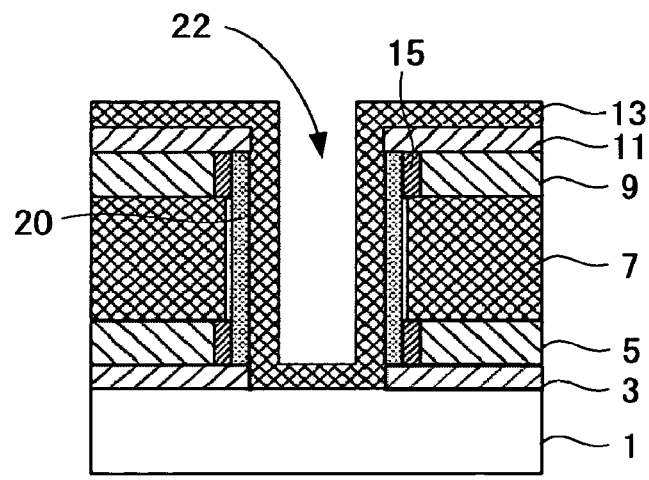

Next, as shown in FIG. 5E, carbon nanotube 20 is made coating the surface of the formed hole 22 and by CVD method, insulating layer 13 ($SiO_2$) is formed to a thickness of 20 nm. As a result, insulating layer 13 is continuously formed inside hole 22 and on the surface of metal layer 11. The above-mentioned is the insulating layer coating process.

Figure 5F:
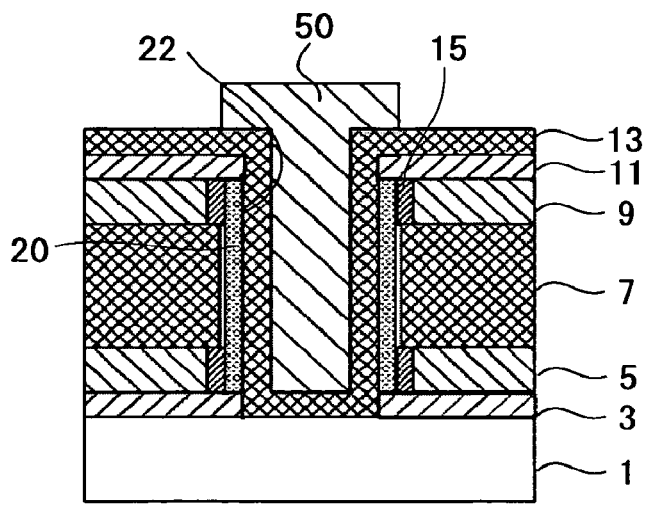

Next, as shown in FIG. 5F, to bury the space of the inside of hole 22, third electrode 50 (Ti—Au electrode (thickness of Ti layer/thickness of Au layer=10 nm/100 nm)) is formed on insulating film 13 ($SiO_2$) to a diameter of 110 nm by patterning method and vapor deposition and lift-off method by resist. The above-mentioned is the third electrode forming process.

According to the above-mentioned, vertical field effect transistor is manufactured.

EXAMPLE 2

FIGS. 6A to 6F are process drawings for describing a manufacturing process of a field effect transistor of the present invention. Out of the codes in FIGS. 6A to 6F, the codes equal to the one in FIGS. 5A to 5F are the same as the one described in FIGS. 5A to 5F.

Figure 6A:
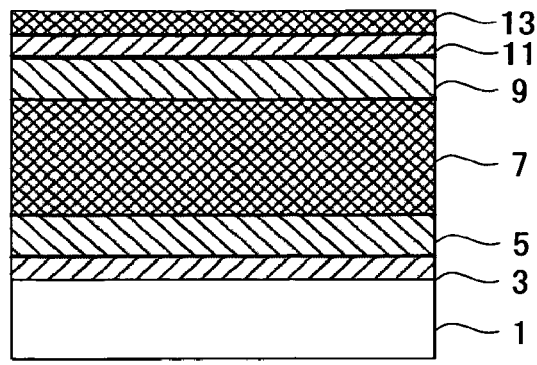
FIGS. 6A to 6F are process drawings for describing another example of a manufacturing process of a field effect transistor of the present invention.

Firstly, as shown in FIG. 6A, catalyst metal layer 3, titanium layer 5, insulating layer 7, titanium layer 9, metal layer 11, and insulating layer 13 are laminated formed on substrate 1 in this order. The laminated forming is performed the same with the one shown in FIG. 5A of example 1.

Figure 6B:
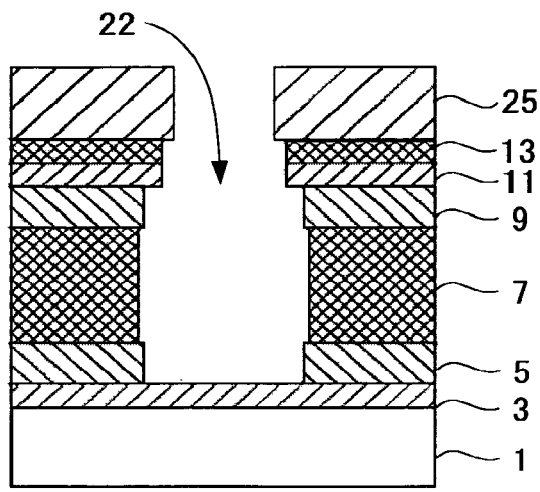

Next, as shown in FIG. 6B, a region of one part of the laminated structure is patterned by forming resist layer 25 and is selectively removed until the surface of catalyst metal layer 3 exposes using ion milling method. Next, by dry etching method using fluorine gas, side-etching is performed so that the diameter of the inner wall of hole 22 becomes bigger than the opening size of hole 22, only titanium layer 5, insulating layer 7 and titanium layer 9 are removed, and catalyst metal layer 3 and metal layer 11 are made protruded into the inside of hole 22 more than these layers. The opening diameter of hole 22 formed like this is 2 μm.

Figure 6C:
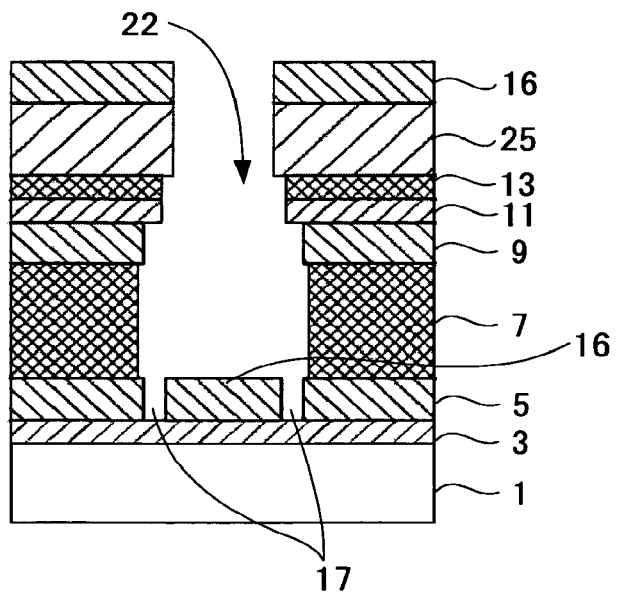

Next, as shown in FIG. 6C, on the bottom of hole 22 (exposed catalyst metal layer 3) and on resist layer 25, titanium layer 16 is formed to a thickness of 100 nm by sputtering method. Accordingly, on the bottom of hole 22 (exposed catalyst metal layer 3), ring shape groove 17 is formed by lift-off method. Catalyst metal layer 3 is exposed in a ring shape by ring shape groove 17.

Figure 6D:
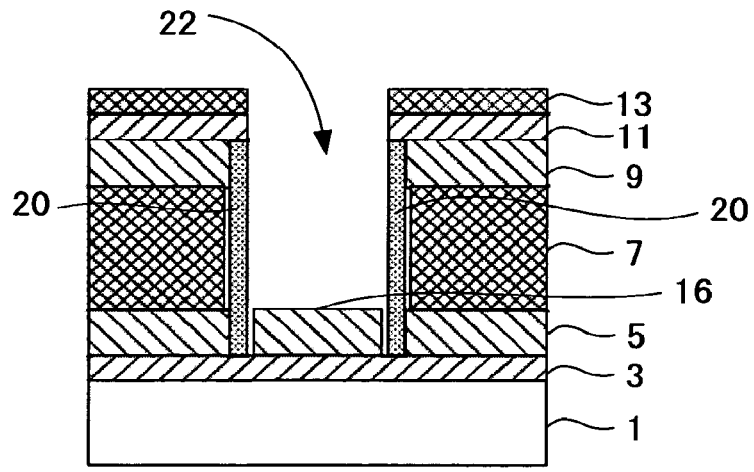

Next, as shown in FIG. 6D, inside hole 22, when the ring shape exposed part of catalyst metal layer 3 and the exposed part of metal layer 11 are catalyst for manufacturing, carbon nanotube 20 is stretched formed by thermal CVD method, and catalyst metal layer 3 and metal layer 11 are connected by carbon nanotube 20. This thermal CVD method is performed by introducing a gas mixture of acetylene 80 sccm and hydrogen 20 sccm as the reaction gas into the vacuum chamber at a condition of pressure 200 Pa and substrate temperature 900° C. As a result, by the observation by SEM, 500 tubes of single layer carbon nanotube of diameter 1.3 nm arranging in a circular shape along the inner wall of hole 22 are confirmed.

Figure 6E:
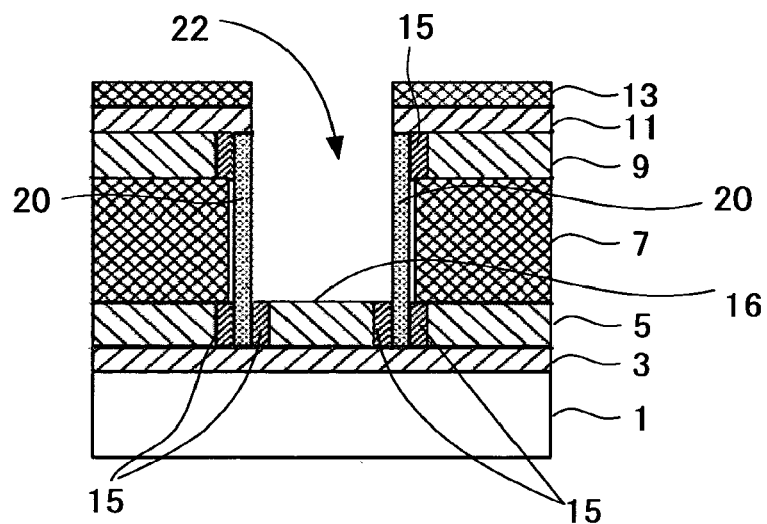

Next, as shown in FIG. 6E, by performing an hour heating treatment at 800° C. in a vacuum, carbon nanotube 20 reacts in the contacted part of titanium layer 5 and titanium layer 9, and TiC layer 15 is formed in the contacted part. As a result, carbon nanotube 20 can be ohmic contacted with the upper electrode and the lower electrode. The above-mentioned is the semiconductive rod-shaped body formation process.

Figure 6F:
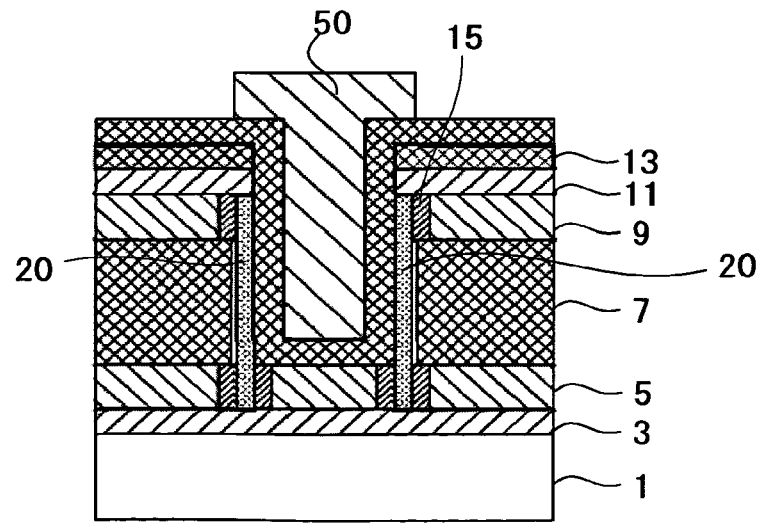

Next, as shown in FIG. 6F, carbon nanotube 20 is made coating the surface of the formed hole 22 and by CVD method, insulating layer 13 ($SiO_2$) is formed to a thickness of 20 nm. As a result, insulating layer 13 is continuously formed inside hole 22 and on the surface of metal layer 11. The above-mentioned is the insulating layer coating process. Further, to bury the space of the inside of hole 22, third electrode 50 (Ti—Au electrode (thickness of Ti layer/thickness of Au layer=10 nm/100 nm)) is formed on insulating film 13 ($SiO_2$) to a diameter of 110 nm by patterning method and vapor deposition and lift-off method by resist. The above-mentioned is the third electrode forming process.

According to the above-mentioned, vertical field effect transistor is manufactured.

According to the present invention, the above circumstances have been accomplished, and a high-performance vertical field effect transistor having a microminiaturized structure able to made short the distance between the gate and the channel not through a microfabrication process, having a large gate capacitance, and so elaborated that the gate can control the channel current with a low voltage, and a method for simply and efficiently manufacturing such a field effect transistor not through a complex process such as a microfabrication process can be provided.

What is claimed is:

1. A manufacturing method of a field effect transistor comprising:
   a semiconductive rod-shaped body formation step of forming a hole exposing first and second electrodes arranged through an insulating layer, forming a semiconductor rod-shaped body along an inner wall of the hole and interconnecting the first and second electrodes, wherein the semiconductive rod-shaped body is provided along the inner wall of the hole in which the first and second electrodes are exposed, and said hole extends entirely through at least one of the first and second electrodes and extends at least partially through a remaining first or second electrode;
   an insulating layer coating step of coating the insulating layer on the an exposed surface of the hole forming the semiconductive rod-shaped body; and
   a third electrode forming step of forming the a third electrode so as to bury the hole coated on the insulating layer.

2. A manufacturing method of a field effect transistor according to claim 1, wherein the first electrode and the second electrode comprises a laminated structure where a material layer capable of reacting with the semiconductive rod-shaped body is formed on a metal layer, and the material layer of the first electrode and the material layer of the second electrode are arranged opposite to each other, and
   in the semiconductive rod-shaped body formation step of, forming a feedthrough hole on only one side of the first electrode and the second electrode, and forming the hole by exposing the metal layer of the other electrode.

3. A manufacturing method of a field effect transistor according to claim 1, wherein the semiconductive rod-shaped body formation step of forms the semiconductive rod-shaped body by CVD method.

* * * * *